(12) United States Patent  (10) Patent No.: US 7,804,128 B2
Ariyoshi et al.  (45) Date of Patent: Sep. 28, 2010

(54) NONVOLATILE SEMICONDUCTOR MEMORY DEVICE

(75) Inventors: Keiko Ariyoshi, Yokohama (JP); Akira Takashima, Fuchu (JP); Shoko Kikuchi, Kawasaki (JP); Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 64 days.

(21) Appl. No.: 12/199,036

(22) Filed: Aug. 27, 2008

(65) Prior Publication Data
US 2009/0057751 A1 Mar. 5, 2009

(30) Foreign Application Priority Data
Aug. 28, 2007 (JP) ............................. 2007-221493

(51) Int. Cl.
H01L 21/8247 (2006.01)
H01L 29/788 (2006.01)
H01L 29/792 (2006.01)
H01L 27/115 (2006.01)

(52) U.S. Cl. .................. 257/326; 257/314; 257/324; 257/411; 257/E29.309; 257/E29.255; 438/287

(58) Field of Classification Search ................. 257/314, 257/324, 411, E21.409, E21.423, E29.255, 257/E29.309; 438/287
See application file for complete search history.

(56) References Cited

U.S. PATENT DOCUMENTS

| 4,870,470 | A * | 9/1989 | Bass et al. ................ 257/324 |
| 6,693,321 | B1 * | 2/2004 | Zheng et al. .............. 257/314 |
| 6,740,605 | B1 * | 5/2004 | Shiraiwa et al. .......... 438/795 |
| 7,365,389 | B1 * | 4/2008 | Jeon et al. ................ 257/325 |
| 2005/0151184 | A1 | 7/2005 | Lee et al. |
| 2005/0242387 | A1 * | 11/2005 | Forbes ..................... 257/314 |
| 2006/0157754 | A1 * | 7/2006 | Jeon et al. ................ 257/288 |
| 2006/0289895 | A1 * | 12/2006 | Kamata .................... 257/192 |
| 2008/0121978 | A1 * | 5/2008 | Sawamura ................ 257/321 |
| 2008/0315288 | A1 * | 12/2008 | Kikuchi et al. ............ 257/321 |
| 2009/0057753 | A1 * | 3/2009 | Ino ........................... 257/324 |
| 2009/0242963 | A1 | 10/2009 | Shingu et al. |

FOREIGN PATENT DOCUMENTS

JP  2004-158810  6/2004

(Continued)

OTHER PUBLICATIONS

U.S. Appl. No. 12/506,588, filed Jul. 21, 2009 Takashima et al.

(Continued)

*Primary Examiner*—Zandra Smith
*Assistant Examiner*—Jeremy J Joy
(74) *Attorney, Agent, or Firm*—Oblon, Spivak, McClelland, Maier & Neustadt, L.L.P.

(57) ABSTRACT

A nonvolatile semiconductor memory device according to an example of the present invention includes a semiconductor region, source/drain areas arranged separately in the semiconductor region, a tunnel insulating film arranged on a channel region between the source/drain areas, a floating gate electrode arranged on the tunnel insulating film, an inter-electrode insulating film arranged on the floating gate electrode, and a control gate electrode arranged on the inter-electrode insulating film. The inter-electrode insulating film includes La, Al and Si.

18 Claims, 14 Drawing Sheets

FOREIGN PATENT DOCUMENTS

| | | |
|---|---|---|
| JP | 2004-336044 | 11/2004 |
| JP | 2006-203200 | 8/2006 |
| JP | 2007-53171 | 3/2007 |
| JP | 2007-134681 | 5/2007 |
| WO | WO 2004/077501 A2 | 9/2004 |

OTHER PUBLICATIONS

U.S. Appl. No. 12/506,534, filed Jul. 21, 2009 Okamura et al.

* cited by examiner

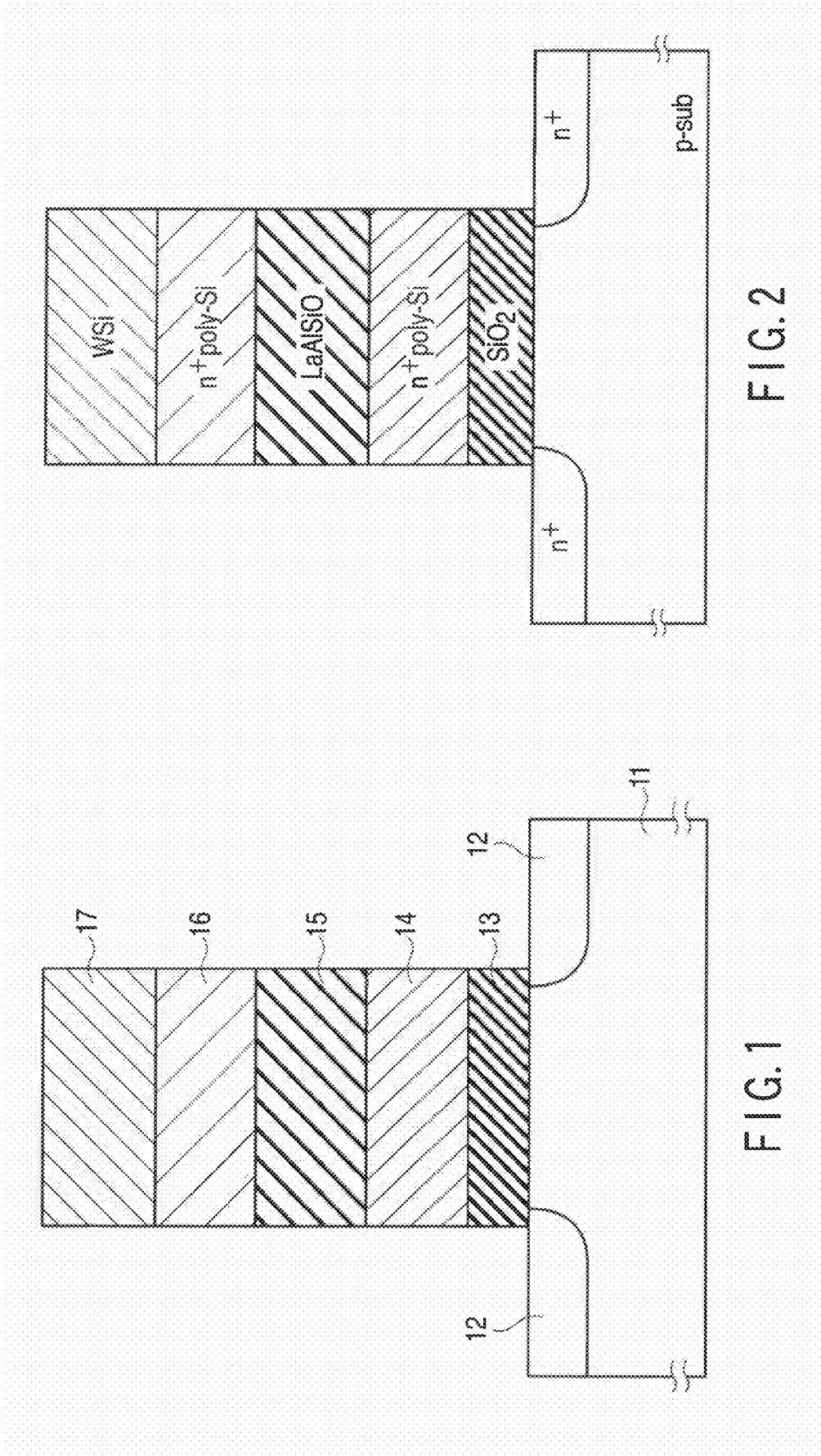

NONVOLATILE SEMICONDUCTOR MEMORY DEVICE

CROSS-REFERENCE TO RELATED APPLICATIONS

This application is based upon and claims the benefit of priority from prior Japanese Patent Application No. 2007-221493, filed Aug. 28, 2007, the entire contents of which are incorporated herein by reference.

BACKGROUND OF THE INVENTION

1. Field of the Invention

The present invention relates to a nonvolatile semiconductor memory device.

2. Description of the Related Art

With further increase in capacity of memory, micro fabrication of cell size further advances in nonvolatile semiconductor memories, for example, flash memories. At the same time, it is necessary not to reduce the coupling ratio in a memory cell.

As a technique of increasing the coupling ratio of a memory cell, considering device structure, there is, for example, a structure (hereinafter, referred to as stereoscopic memory cell structure) in which a control gate electrode covers the lateral surface of a floating gate electrode in the channel longitudinal direction (in the direction orthogonal to the direction of a word line extending as the control gate electrode).

In the stereoscopic memory cell structure, however, problems about interference between the adjacent cells and space for embedding an insulating film between the adjacent cells are inevitable according to the micro fabrication of a memory cell. Therefore, a structure (hereinafter, referred to as a flat cell structure) in which a control gate electrode does not cover the lateral surface of a floating gate electrode in its channel longitudinal direction is preferable.

In order to increase the coupling ratio in the flat cell structure, with respect to a material, for example, a high dielectric constant material (so called High-k material) having a higher dielectric constant than that of $SiO_2/SiN/SiO_2$ (hereinafter, referred to as ONO film) is used for an inter-electrode insulating film between a floating gate electrode and a control gate electrode (for example, refer to JP-A 2006-203200 (KOKAI) and JP-A 2004-158810 (KOKAI)).

Here, care should be taken to the fact that a high electric field is applied on the inter-electrode insulating film in the flat cell structure. In other words, the inter-electrode insulating film has to have a small leak current from a region of low electric field to a region of high electric field, as well as a high dielectric constant.

This is true in a memory cell formed by an insulating film having a charge storage layer of trap function, for example, in a memory cell of the MONOS (metal-oxide-nitride-oxide-silicon) structure. Namely, a block insulating film between a charge storage layer and a control gate electrode is required to have a high dielectric constant and less leak current in the region of high electric field.

In the progress of micro fabrication of a memory cell, a material having this quality has not been fully considered so far.

When forming an inter-electrode insulating film or a block insulating film of high dielectric constant material, it is preferable that the high dielectric constant material is amorphous.

This fabrication process of a memory cell is accompanied by the thermal processing at a high temperature of 900 to 1000° C.

This thermal processing induces the amorphous high dielectric constant material to crystallize and causes the memory cell to deteriorate in electrical characteristic.

Accordingly, it is necessary to develop an inter-electrode insulating film and a block insulating film having a high stability against heat capable of remaining amorphous even after the thermal processing of high temperature.

BRIEF SUMMARY OF THE INVENTION

A nonvolatile semiconductor memory device of an aspect of the present invention comprises a semiconductor region, source/drain areas arranged separately in the semiconductor region, a tunnel insulating film arranged on a channel region between the source/drain areas, a floating gate electrode arranged on the tunnel insulating film, an inter-electrode insulating film arranged on the floating gate electrode, and a control gate electrode arranged on the inter-electrode insulating film. The inter-electrode insulating film includes La, Al and Si.

A nonvolatile semiconductor memory device of an aspect of the present invention comprises a semiconductor region, source/drain areas arranged separately in the semiconductor region, a tunnel insulating film arranged on a channel region between the source/drain areas, a charge storage layer arranged on the tunnel insulating film, a block insulating film arranged on the charge storage layer, and a control gate electrode arranged on the block insulating film. The block insulating film includes La, Al and Si.

BRIEF DESCRIPTION OF THE SEVERAL VIEWS OF THE DRAWING

FIG. 1 is a cross-sectional view showing a structure of an example of the invention;

FIG. 2 is a cross-sectional view showing a nonvolatile semiconductor memory according to a first embodiment;

DETAILED DESCRIPTION OF THE INVENTION

Figure 3:
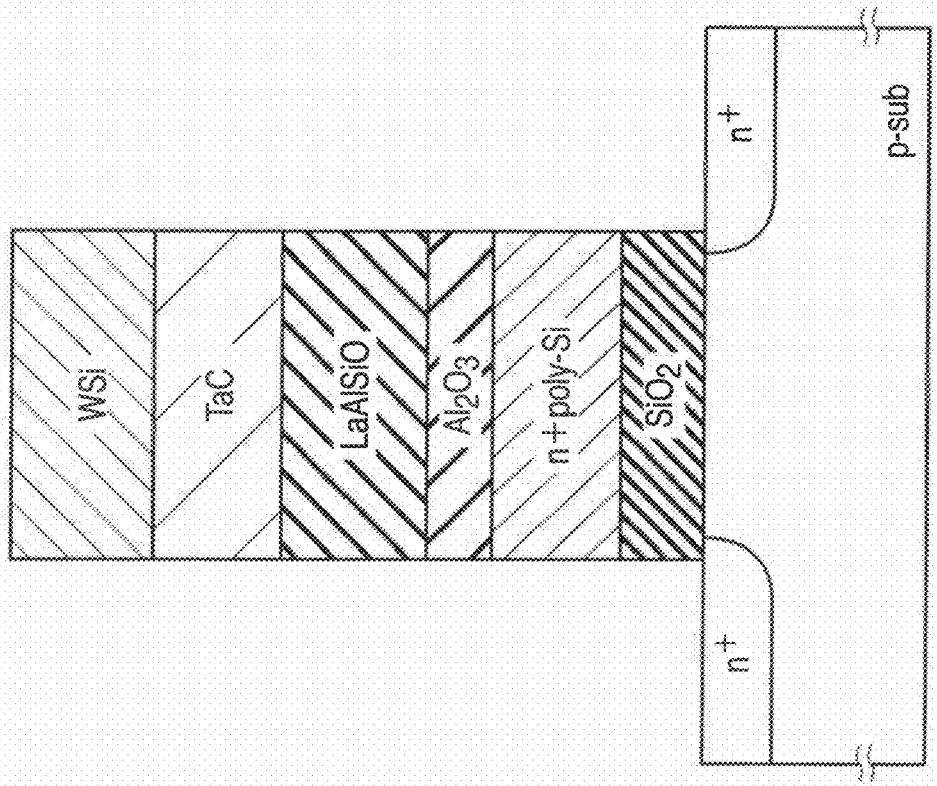
FIG. 3 is a cross-sectional view showing a nonvolatile semiconductor memory according to a second embodiment.

A nonvolatile semiconductor memory device of an aspect of the present invention will be described below in detail with reference to the accompanying drawings.

1. Outline

It is a main point of the invention that when forming an inter-electrode insulating film or a block insulating film of high dielectric constant material, the leak current from a low electric field region to a high electric field region gets smaller than a reference value required according to the device specification and the invention is characterized by the composition of a high dielectric constant material having a high stability against heat.

Specifically, an inter-electrode insulating film or a block insulating film is formed in a single layer structure or a stack layer structure of insulators (for example, oxide, oxynitride, and the like) including La, Al, and Si. It is further preferable that the composition ratio of the inter-electrode insulating film or the block insulating film is set within the range of $0.06<Si/(La+Al)<0.60$.

According to this, the coupling ratio can be improved by using the inter-electrode insulating film or the block insulating film of high dielectric constant and at the same time, the leak current characteristic can be improved in the inter-electrode insulating film or the block insulating film, while keeping a stability against heat.

The inter-electrode insulating film and the block insulating film are defined below:

The inter-electrode insulating film is an insulator which blocks an electron flow between a floating gate electrode as a charge storage layer and a control gate electrode. The block insulating film is an insulator which blocks an electron flow between an insulating layer as a charge storage layer and a control gate electrode.

2. Principle of the Invention

In the fabrication process of a memory cell, after doping impurities in source/drain areas, a thermal treatment at a high temperature of 900 to 1000° C. is performed in order to activate the impurities. When forming an inter-electrode insulating film or a block insulating film of high dielectric constant material, however, this thermal treatment causes crystallization of a high dielectric constant material which is not intended to crystallize, which deteriorates the electrical characteristic. Therefore, it is absolutely necessary to develop a high dielectric constant material with high heat resistance capable of remaining amorphous before and after the thermal treatment.

A high dielectric constant material including La, Al, and O, for example, lanthanum aluminate ($LaAlO_3$) is a material of leak current in a high electric field region (for example, refer to JP A 2007-165366 filed in Jun. 22, 2007).

The lanthanum aluminate, however, is known to crystallize at about 900° C. into a Perovskite structure.

Taking into account that crystallization of a material is affected not only by the temperature of a thermal treatment but also by the composition, the inventor et al. have investigated a relation between composition ratio and crystallization as for an insulator including La, Al, and Si (for example, oxide, oxynitride, and the like).

Figure 20:
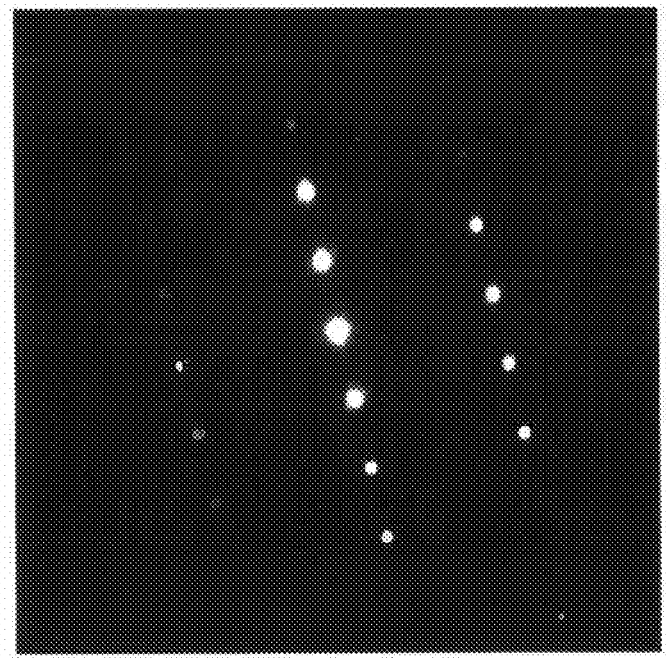
FIG. 20 is a view showing a TED image by cross section TEM.

FIG. 20 is a transmission electron diffraction (TED) image of the amorphous lanthanum aluminate after the thermal treatment at about 1000° C. obtained by a cross section TEM (transmission electron microscopy).

After the thermal treatment, diffraction spots are found in the lanthanum aluminate and it is proved that the lanthanum aluminate is crystallized.

Figure 21:
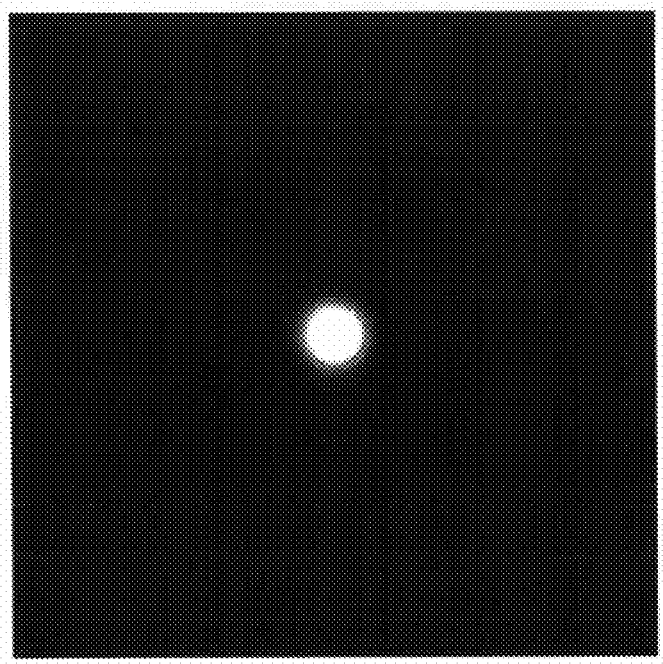
FIG. 21 is a view showing a TED image by cross section TEM.

While, FIG. 21 is a transmission electron diffraction image of the amorphous lanthanum aluminate with Si added, after the same thermal treatment, obtained by the cross section TEM.

In the amorphous lanthanum aluminate with Si added, any diffraction spots indicating that it is a crystal layer are not found and it is proved that it remains amorphous.

When a relation between the composition ratio $Si/(La+Al)$ and crystallization of the Si added lanthanum aluminate is investigated, it is proved that it remains amorphous completely after and before the thermal treatment within the range of $0.06<Si/(La+Al)$. Taking into consideration that the dielectric constant of the high dielectric constant material is reduced according to an increase in the ratio of Si included in the high dielectric constant material, it is preferable that $Si/(La+Al)<0.60$.

By adding Si to the lanthanum aluminate, its crystallization due to the thermal treatment can be prevented and it is preferable that the composition ratio is within the range of $0.06<Si/(La+Al)<0.60$.

Adding Si to the amorphous lanthanum aluminate is performed, for example, by stacking a material including Si and lanthanum aluminate. In this case, in the thermal treatment at about 1000° C., the Si is diffused into the lanthanum aluminate from the material including Si, hence to prevent from crystallization of the lanthanum aluminate.

Here, it is important to accurately control the ratio of Si included in the high dielectric constant material.

When a floating gate electrode or a control gate electrode is formed of a material including Si, the Si is diffused from the floating gate electrode or the control gate electrode into the high dielectric constant material in the fabrication process and it is difficult to accurately control the ratio of Si in the high dielectric constant material.

There is a fact that according to an increase in the ratio of Si included in the high dielectric constant material, the dielectric constant of the high dielectric constant material is decreased.

In order to prevent Si from diffusing from the floating gate electrode or the control gate electrode and to accurately control the ratio of Si included in the high dielectric constant material, it is preferable that a barrier layer formed of Al oxide ($Al_2O_3$) is arranged between the floating gate electrode and the high dielectric constant material or between the control gate electrode and the high dielectric constant material.

3. Basic Structure

The basic structure of a nonvolatile semiconductor memory according to examples of the invention will be described hereinafter.

FIG. 1 shows a nonvolatile semiconductor memory.

Second conductive source/drain diffusion layers (source/drain areas) 12 are separately arranged in a first conductive semiconductor substrate (semiconductor area) 11. The semiconductor substrate 11 is, for example, a silicon substrate. The source/drain diffusion areas 12 may be formed in the well regions in the semiconductor substrate 11.

A charge storage layer 14 is arranged above a channel region between the source/drain diffusion areas 12 via a tunnel insulating film (for example, silicon oxide) 13. The control gate electrodes 16 and 17 are arranged above the charge storage layer 14 via an insulating film 15.

Here, the charge storage layer 14 may be conductive or insulative.

When the charge storage layer 14 is conductive (for example, conductive polysilicon), the charge storage layer becomes a floating gate electrode. In this case, the insulating film 15 between the floating gate electrode 14 and the control gate electrodes 16 and 17 become an inter-electrode insulating film. The insulating film 15 between the charge storage layer 14 and the control gate electrodes 16 and 17 becomes a block insulating film, when the charge storage layer 14 is insulator (for example, silicon nitride).

The control gate electrode 16 is formed of, for example, conductive polysilicon and the control gate electrode 17 is formed of, for example, metal silicide.

As described in the Outline, a main point of the invention is in the composition of the insulating film (inter-electrode insulating film or block insulating film) 15.

The insulating film 15 is formed of such a material that the leak current becomes smaller than a reference value when a writing electric field requested by the device specification is applied.

Here, the writing electric field requested by the device specification is 20 to 30 MV/cm for the inter-electrode insulating film and 15 to 25 MV/cm for the block insulating film.

In the invention, as such a material, an insulator including La, Al, and Si (for example, oxide, oxynitride, and the like) is used. When the insulating film 15 is formed of this insulator, the insulating film 15 may take a single layer structure or a stack layer structure.

The composition ratio of the insulating film 15 is within the range of $0.06<Si/(La+Al)<0.60$.

When the semiconductor substrate 11 is p-type and the source/drain diffusion areas 12 are n-type, the nonvolatile memory cell becomes an n-channel typed MOSFET and when the semiconductor substrate 11 is n-type and the source/drain diffusion areas 12 are p-type, the nonvolatile memory cell becomes a p-channel typed MOSFET.

Although it is assumed that the semiconductor substrate 11 and the source/drain diffusion areas 12 are different in conductive type, it is not restricted to this but they may be the same conductive type.

Further, at least one barrier layer or barrier layers formed of Al oxide may be arranged between the charge storage layer 14 and the insulating film 15 or/and between the control gate electrodes 16 and 17 and the insulating film 15.

4. Embodiments

Hereinafter, embodiments of the invention will be described.

(1) First Embodiment

FIG. 2 shows a nonvolatile semiconductor memory according to the first embodiment.

The nonvolatile semiconductor memory is a memory cell having a stack gate structure including a floating gate electrode and a control gate electrode.

The semiconductor substrate is a p-type silicon substrate (p-sub) and the source/drain diffusion areas are n-type. The tunnel insulating film is formed of silicon oxide ($SiO_2$) with thickness of 4 to 8 nm, the floating gate electrode is formed of conductive polysilicon ($n^+$ poly-Si) including n-type impurity, and the inter-electrode insulating film is formed of LaAlSiO with thickness of 10 to 30 nm. The control gate electrode is formed in a stack structure of conductive polysilicon ($n^+$ poly-Si) including the n-type impurity and tungsten silicide (WSi).

The composition ratio of LaAlSiO is set within the range of $0.06<Si/(La+Al)<0.60$.

The control gate electrode may adopt the following material, instead of the above mentioned material.

Polysilicon including p-type impurity

Conductive material including one or more elements selected from Au, Pt, Co, Be, Ni, Rh, Pd, Te, Re, Mo, Al, Hf, Ta, Mn, Zn, Zr, In, Bi, Ru, W, Ir, Er, La, Ti, and Y, or its silicide, boride, nitride, and carbide Especially, when the control gate electrode is formed of a metal having a large work function, the leak current from the inter-electrode insulating film to the control gate electrode is reduced. In this case, since there is no depletion in the control gate electrode, EOT (equivalent oxide thickness) becomes smaller in the inter-electrode insulating film.

The control gate electrode may be formed in a full silicide structure of nickel silicide (NiSi) and cobalt silicide (CoSi), or the like, or only of metal.

The inter-electrode insulating film may further contain nitride (N). In this case, the composition ratio of LaAlSiON is set within the range of $0.06<Si/(La+Al)<0.60$.

The tunnel insulating film is formed in a single layer or a stack layer of the insulating film having smaller dielectric constant than the inter-electrode insulating film, for example, material such as SiN, SiON, and $Al_2O_3$.

(2) Second Embodiment

FIG. 3 shows a nonvolatile semiconductor memory according to the second embodiment.

The nonvolatile semiconductor memory is a variation of the first embodiment, characterized by adding a barrier layer ($Al_2O_3$).

The semiconductor substrate is a p-type silicon substrate (p-sub) and the source/drain diffusion areas are n-type. The tunnel insulating film is formed of silicon oxide ($SiO_2$) with thickness of 4-8 nm, the floating gate electrode is formed of conductive polysilicon ($n^+$ poly-Si) including the n-type impurity, and the inter-electrode insulating film is formed of LaAlSiO with thickness of 10 to 30 nm. The control gate electrode is formed in a stack structure of conductive polysilicon ($n^+$ poly-Si) including the n-type impurity and tungsten silicide (WSi).

A barrier layer ($Al_2O_3$) which prevents the mutual diffusion of Si is 2 to 6 nm thick and it is arranged respectively between the floating gate electrode ($n^+$ poly-Si) and the inter-electrode insulating film (LaSlSiO) and between the control gate electrode ($n^+$ poly-Si/WSi) and the inter-electrode insulating film (LaAlSiO).

The composition ratio of LaAlSiO is set within the range of $0.06<Si/(La+Al)<0.60$.

The material of the control gate electrode can be changed similarly to the first embodiment.

Also when the inter-electrode insulating film is made of LaAlSiO, the composition ratio is set within the range of $0.06<Si/(La+Al)<0.60$.

The tunnel insulating film is formed in a single layer or a stack layer of the insulating film having smaller dielectric constant than the inter-electrode insulating film, for example, material such as SiN, SiON, and $Al_2O_3$.

(3) Third Embodiment

Figure 4:
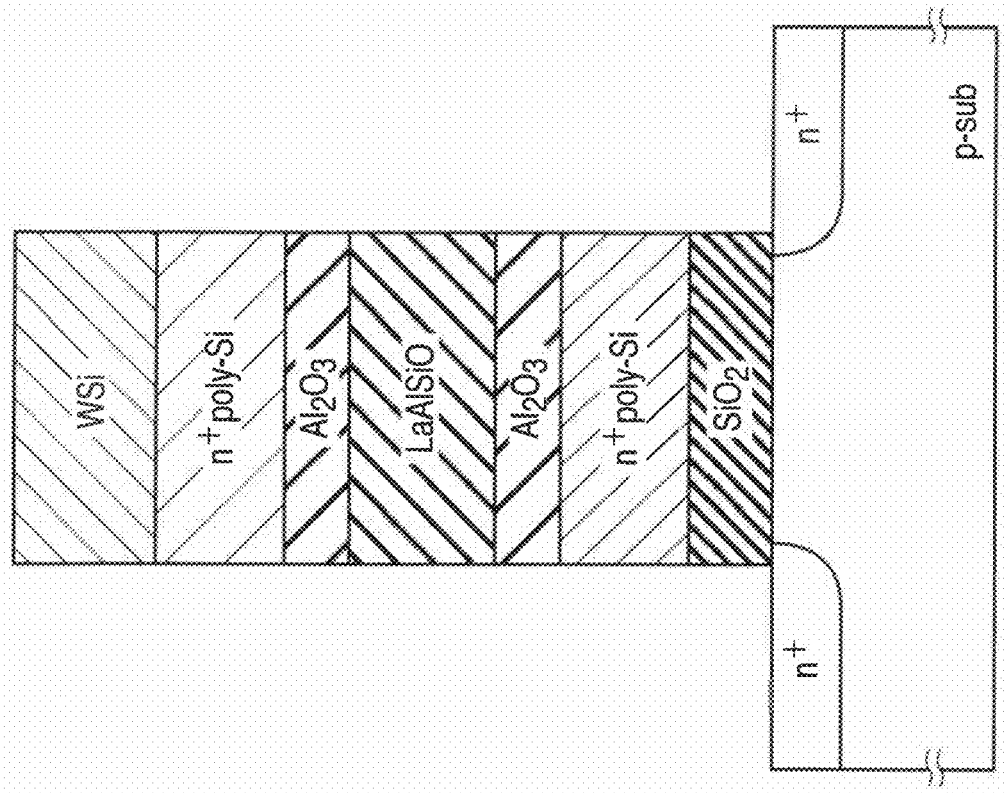
FIG. 4 is a cross-sectional view showing a nonvolatile semiconductor memory according to a third embodiment.

FIG. 4 shows a nonvolatile semiconductor memory according to the third embodiment.

The nonvolatile semiconductor memory is a variation of the second embodiment.

It is characterized in that TaC is used for the control gate electrode and that the barrier layer ($Al_2O_3$) on the inter-electrode insulating film (LaAlSiO) is removed away.

The semiconductor substrate is a p-type silicon substrate (p-sub) and the source/drain diffusion areas are n-type. The tunnel insulating film is formed of silicon oxide ($SiO_2$) with thickness of 4 to 8 nm, the floating gate electrode is formed of conductive polysilicon ($n^+$ poly-Si) including the n-type impurity, and the inter-electrode insulating film is formed of LaAlSiO with thickness of 10 to 30 nm. The control gate electrode is formed in a stack structure of tantalum carbide (TaC) and tungsten silicide (WSi).

The barrier layer ($Al_2O_3$) which prevents the mutual diffusion of Si is 2 to 6 nm thick and it is arranged between the floating gate electrode ($n^+$ poly-Si) and the inter-electrode insulating film (LaAlSiO).

The composition ratio of LaAlSiO is set within the range of $0.06<Si/(La+Al)<0.60$.

The material of the control gate electrode can be changed similarly to the first embodiment.

Also when the inter-electrode insulating film is made of LaAlSiON, the composition ratio is set within the range of $0.06<Si/(La+Al)<0.60$.

The tunnel insulating film is formed in a single layer or a stack layer of the insulating film having smaller dielectric constant than the inter-electrode insulating film, for example, material such as SiN, SiON, and $Al_2O_3$.

(4) Fourth Embodiment

Figure 5:
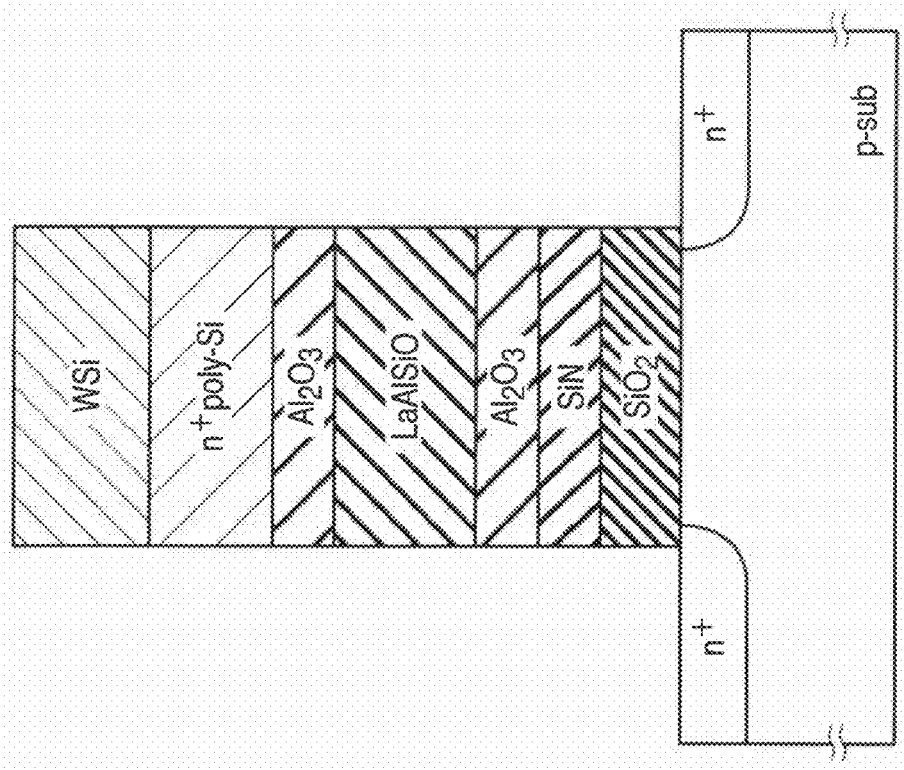
FIG. 5 is a cross-sectional view showing a nonvolatile semiconductor memory according to a fourth embodiment.

FIG. 5 shows a nonvolatile semiconductor memory according to the fourth embodiment.

The nonvolatile semiconductor memory is a memory cell of MONOS structure formed by an insulating film having a charge storage layer trap function.

The semiconductor substrate is a p-type silicon substrate (p-sub) and the source/drain diffusion areas are n-type. The tunnel insulating film is formed of silicon oxide ($SiO_2$) with thickness of 4 to 8 nm, the charge storage layer is formed of silicon nitride (SiN) with thickness of 4 to 6 nm, and the inter-electrode insulating film is formed of LaAlSiO with thickness of 10 to 30 nm. The control gate electrode is formed in a stack structure of conductive polysilicon ($n^+$ poly-Si) including the n-type impurity and tungsten silicide (Wsi).

A barrier layer ($Al_2O_3$) which prevents the mutual diffusion of Si is 2 to 6 nm thick and it is arranged respectively between the charge storage layer (SiN) and the inter-electrode insulating film (LaAlSiO) and between the control gate electrode ($n^+$ poly-Si/WSi) and the inter-electrode insulating film (LaAlSiO).

The composition ratio of LaAlSiO is set within the range of $0.06<Si/(La+Al)<0.60$.

The charge storage layer may be formed of oxynitride silicon (SiON). In this case, the composition of each element doesn't have to be a stoichiometric composition.

The charge storage layer may be formed of oxide, nitride, or oxynitride of material including one or more elements selected from a group of Al, Hf, La, Y, Ce, Ti, Zr, and Ta or may be formed in their stack structure.

Further, the following material may be used for the control gate electrode, instead of the above mentioned materials.

Polysilicon including n-type impurity or polysilicon including p-type impurity

Conductive material including one or more elements selected from Au, Pt, Co, Be, Ni, Rh, Pd, Te, Re, Mo, Al, Hf, Ta, Mn, Zn, Zr, In, Bi, Ru, W, Ir, Er, La, Ti, and Y, or its silicide, boride, nitride, and carbide Especially, when the control gate electrode is formed of a metal having a large work function, the leak current from the inter-electrode insulating film to the control gate electrode is decreased. In this case, since there is no depletion in the control gate electrode, the EOT of the inter-electrode insulating film becomes smaller.

The control gate electrode may be formed in a full silicide structure of nickel silicide (NiSi), cobalt silicide (CoSi), or the like, or only of metal.

The inter-electrode insulating film may contain nitride (N). In this case, the composition ratio of LaAlSiON is set within the range of $0.06<Si/(La+Al)<0.60$.

The tunnel insulating film is formed in a single layer or a stack layer of the insulating film having smaller dielectric constant than the inter-electrode insulating film, for example, material such as SiN, SiON, and $Al_2O_3$.

(5) Fifth Embodiment

Figure 6:
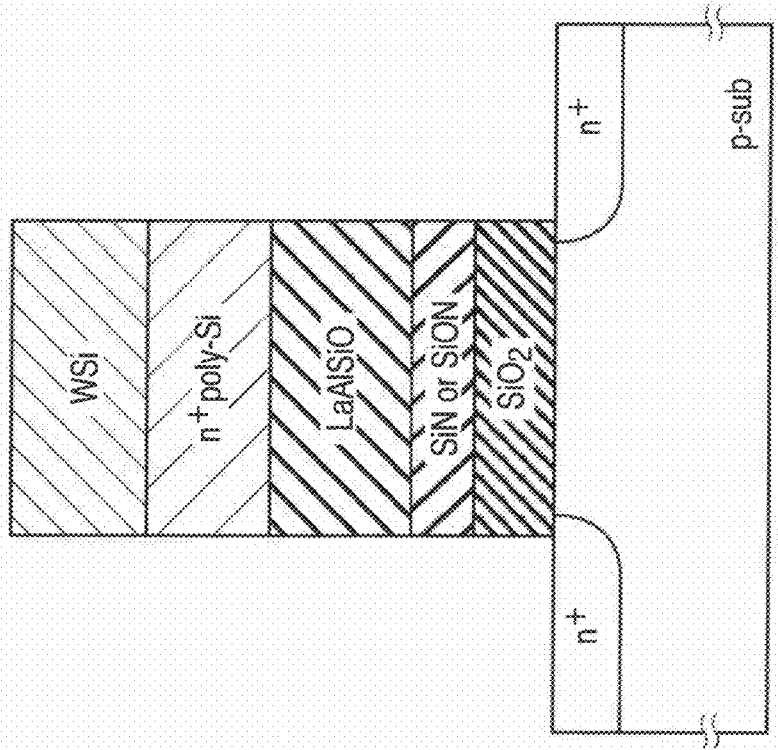
FIG. 6 is a cross-sectional view showing a nonvolatile semiconductor memory according to a fifth embodiment.

FIG. 6 shows a nonvolatile semiconductor memory according to the fifth embodiment.

The nonvolatile semiconductor memory is a memory cell of MONOS structure formed by an insulating film having a charge storage layer trap function.

The semiconductor substrate is a p-type silicon substrate (p-sub) and the source/drain diffusion areas are n-type. The tunnel insulating film is formed of silicon oxide ($SiO_2$) with thickness of 4 to 8 nm, the charge storage layer is formed of silicon nitride (SiN) or silicon oxynitride (SiON) with thickness of 4 to 6 nm, and the inter-electrode insulating film is formed of LaAlSiO with thickness of 10 to 30 nm. The control gate electrode is formed in a stack structure of conductive polysilicon ($n^+$ poly-Si) including the n-type impurity and tungsten silicide (WSi).

The composition ratio of LaAlSiO is set within the range of $0.06<Si/(La+Al)<0.60$.

The charge storage layer may be formed of oxide, nitride, or oxynitride of material including one or more elements selected from a group of Al, Hf, La, Y, Ce, Ti, Zr, and Ta or may be formed in their stack structure.

Further, the following material may be used for the control gate electrode, instead of the above mentioned materials.

Polysilicon including n-type impurity or polysilicon including p-type impurity

Conductive material including one or more elements selected from Au, Pt, Co, Be, Ni, Rh, Pd, Te, Re, Mo, Al, Hf, Ta, Mn, Zn, Zr, In, Bi, Ru, W, Ir, Er, La, Ti, and Y, or its silicide, boride, nitride, and carbide Especially, when the control gate electrode is formed of a metal having a large work function, the leak current from the inter-electrode insulating film to the control gate electrode is decreased. In this case, since there is no depletion in the control gate electrode, the EOT of the inter-electrode insulating film becomes smaller.

The control gate electrode may be formed in a full silicide structure of nickel silicide (NiSi), cobalt silicide (CoSi), or the like, or only of metal.

The inter-electrode insulating film may contain nitride (N). In this case, the composition ratio of LaAlSiON is set within the range of $0.06<Si/(La+Al)<0.60$.

The tunnel insulating film is formed in a single layer or a stack layer of the insulating film having smaller dielectric constant than the inter-electrode insulating film, for example, material such as SiN, SiON, and $Al_2O_3$.

(6) Sixth Embodiment

Figure 7:
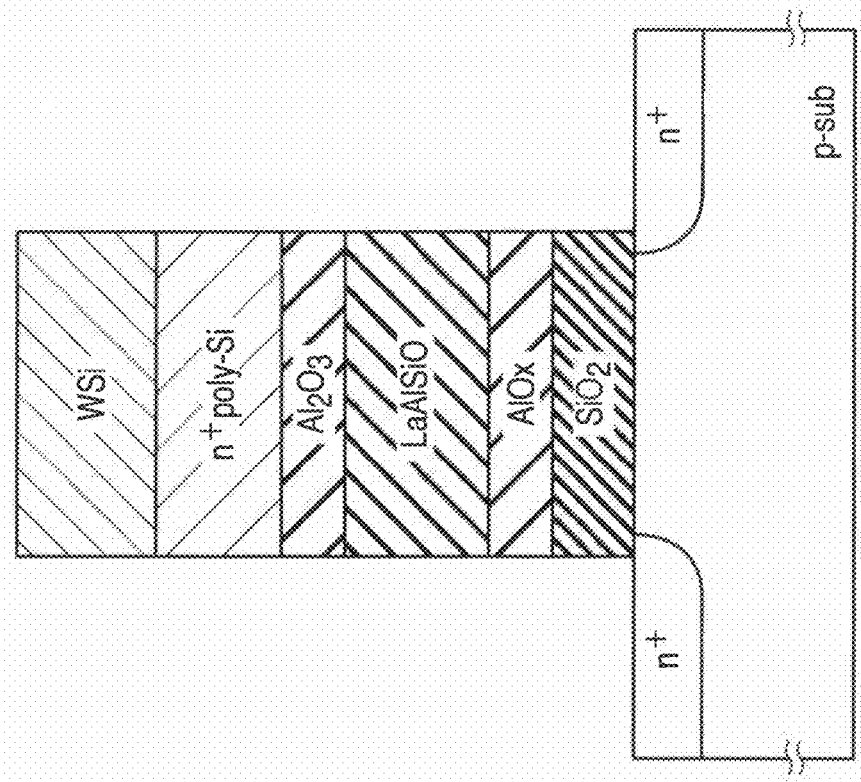
FIG. 7 is a cross-sectional view showing a nonvolatile semiconductor memory according to a sixth embodiment.

FIG. 7 shows a nonvolatile semiconductor memory according to the sixth embodiment.

The nonvolatile semiconductor memory is a variation of the fourth embodiment.

It is characterized in that AlOx is used for the charge storage layer and the barrier layer ($Al_2O_3$) under the inter-electrode insulating film (LaAlSiO) is removed away. Here, "X" of AlOx means that there is a case in which the actual film composition doesn't become a theoretical value owing to the oxygen depletion.

The semiconductor substrate is a p-type silicon substrate (p-sub) and the source/drain diffusion layers are n-type. The tunnel insulating film is formed of silicon oxide ($SiO_2$) with thickness of 4 to 8 nm, the charge storage layer is formed of AlOx with thickness of 4-6 nm, and the inter-electrode insulating film is formed of LaAlSiO with thickness of 10 to 30 nm. The control gate electrode is formed in a stack structure of conductive polysilicon ($n^+$ poly-Si) including the n-type impurity and tungsten silicide (WSi).

A barrier layer ($Al_2O_3$) which prevents the mutual diffusion of Si is 2 to 6 nm thick and it is arranged between the control gate electrode ($n^+$ poly-Si/WSi) and the inter-electrode insulating film (LaAlSiO).

The composition ratio of LaAlSiO is set within the range of $0.06<Si/(La+Al)<0.60$.

The material of the control gate electrode can be changed similarly to the first embodiment.

Also when the inter-electrode insulating film is made of LaAlSiON, the composition ratio is set within the range of $0.06<Si/(La+Al)<0.60$.

The tunnel insulating film is formed in a single layer or a stack layer of the insulating film having smaller dielectric constant than the inter-electrode insulating film, for example, material such as SiN, SiON, and $Al_2O_3$.

(7) Seventh Embodiment

Figure 8:
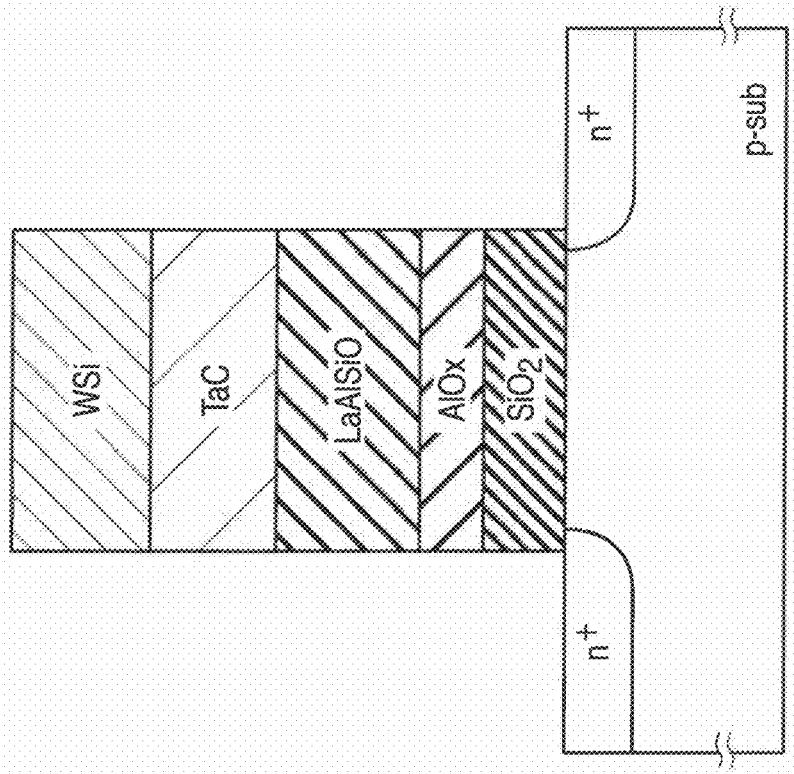
FIG. 8 is a cross-sectional view showing a nonvolatile semiconductor memory according to a seventh embodiment.

FIG. 8 shows a nonvolatile semiconductor memory according to the seventh embodiment.

This nonvolatile semiconductor memory is a variation of the sixth embodiment.

It is characterized in that TaC is used for the control gate electrode and the barrier layer ($Al_2O_3$) on the inter-electrode insulating film (LaAlSiO) is removed away.

The semiconductor substrate is a p-type silicon substrate (p-sub) and the source/drain diffusion areas are n-type. The tunnel insulating film is formed of silicon oxide ($SiO_2$) with thickness of 4 to 8 nm, the charge storage layer is formed of AlOx with thickness of 4 to 6 nm, and the inter-electrode insulating film is formed of LaAlSiO with thickness of 10 to 30 nm. The control gate electrode is formed in a stack structure of tantalum carbide (TaC) and tungsten silicide (WSi).

The composition ratio of LaAlSiO is set within the range of $0.06<Si/(La+Al)<0.60$.

The material of the control gate electrode can be changed similarly to the first embodiment.

Also when the inter-electrode insulating film is made of LaAlSiON, the composition ratio is set within the range of $0.06<Si/(La+Al)<0.60$.

The tunnel insulating film is formed in a single layer or a stack layer of the insulating film having smaller dielectric constant than the inter-electrode insulating film, for example, material such as SiN, SiON, and $Al_2O_3$.

In this embodiment, since the inter-electrode insulating film is not in contact with the material including Si, it is not necessary to provide a barrier layer ($Al_2O_3$).

(8) Others

In the above mentioned first to seventh embodiments, although a memory cell is formed on the silicon substrate, it may be formed on the SOI (Silicon on Insulator) or on the polycrystalline silicon layer.

Further, a memory cell may be of a fin (Fin) type.

5. Application Example

The invention may be applied to the general nonvolatile semiconductor memory which stores data through input and output of charge to and from the charge storage layer. Here, its representative examples will be described.

(1) NAND Type Flash Memory

Figure 9:
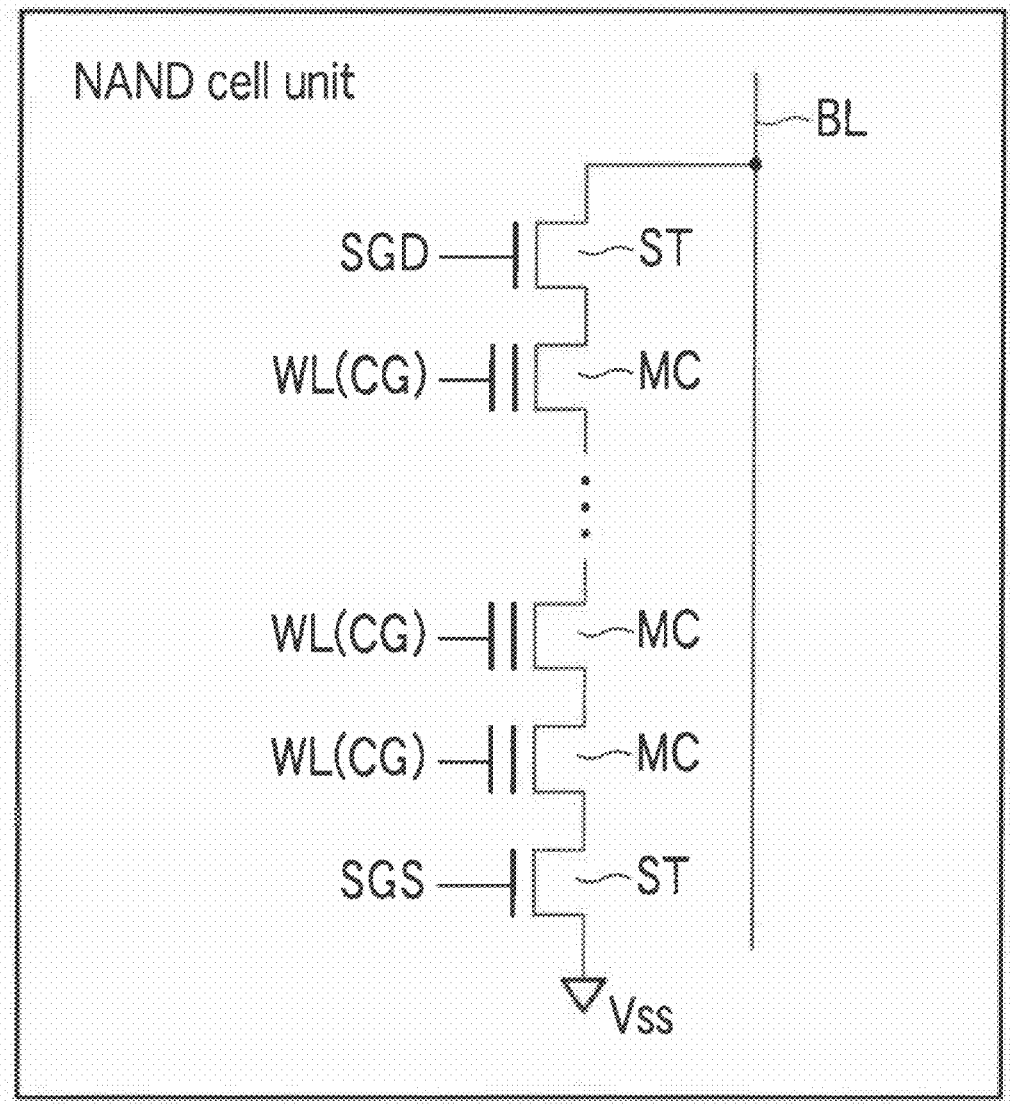
FIG. 9 is a circuit diagram showing a NAND cell unit.
Figure 10:
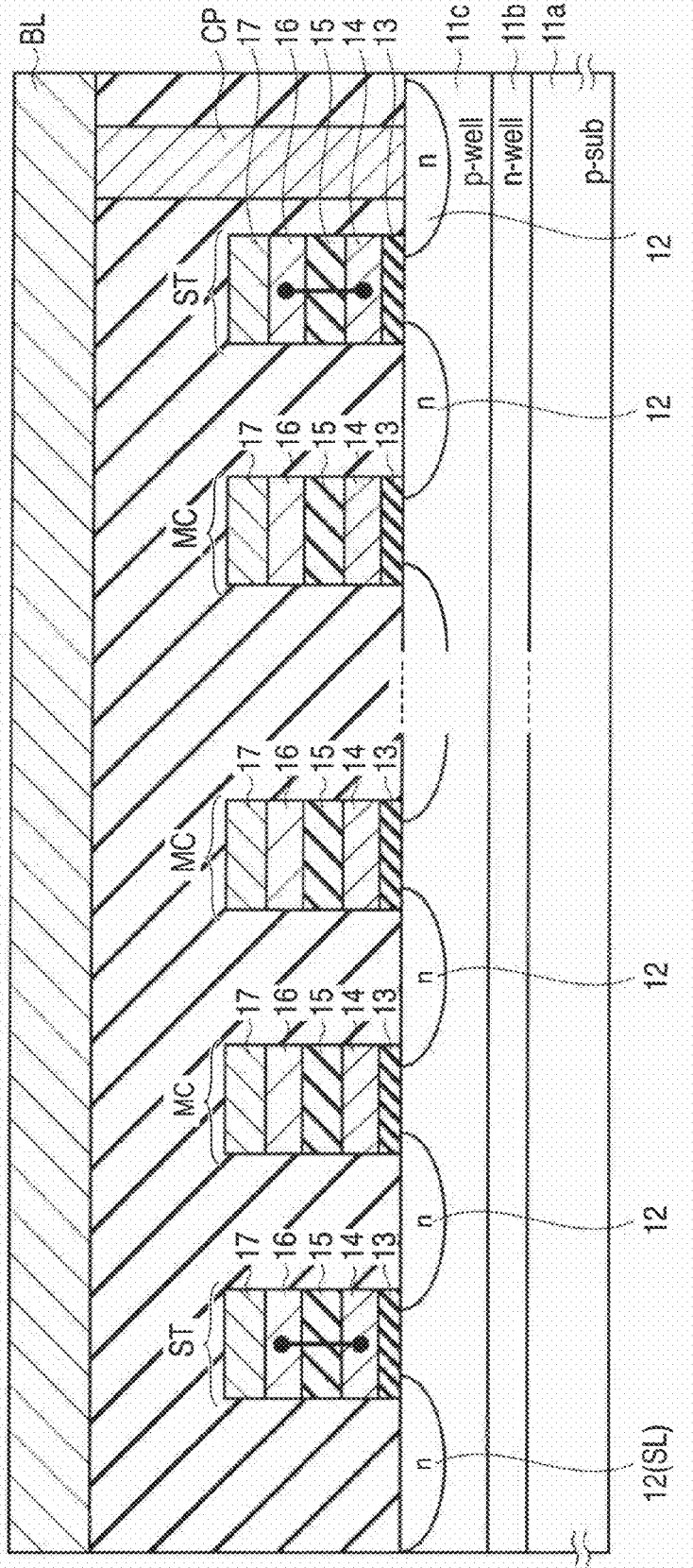
FIG. 10 is a cross-sectional view showing a device structure of the NAND cell unit.

FIG. 9 shows a circuit diagram of a NAND cell unit. FIG. 10 shows a device structure of the NAND cell unit.

An n-type well region 11b and a p-type well region 11c are formed in the p-type semiconductor substrate 11a. A NAND cell unit including the memory cell of the invention is formed in the p-type well region 11c.

The NAND cell unit is formed by the NAND string comprising of several memory cells MCs connected in series and two select gate transistors STs in total connected to its both ends.

Each of the memory cells MCs and the select gate transistors STs is formed by the gate insulating film 13 on a channel region between the both n-type diffusion areas 12, the floating gate electrode 14 on the gate insulating film 13, the inter-electrode insulating film 15 on the floating gate electrode 14, and the control gate electrodes 16 and 17 on the inter-electrode insulating film 15.

The select gate transistor ST has the same structure as that of the memory cell MC except that the floating gate electrode 14 is electrically connected to the control gate electrodes 16 and 17 through hole provided in the inter-electrode insulating film 15.

One of the select gate transistors STs is connected to the source line SL and the other is connected to the bit line BL.

(2) NOR-type Flash Memory

Figure 11:
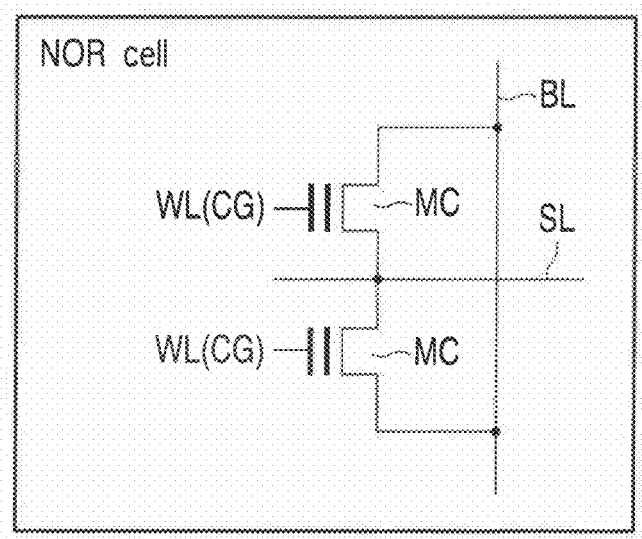
FIG. 11 is a circuit diagram showing a NOR cell unit.
Figure 12:
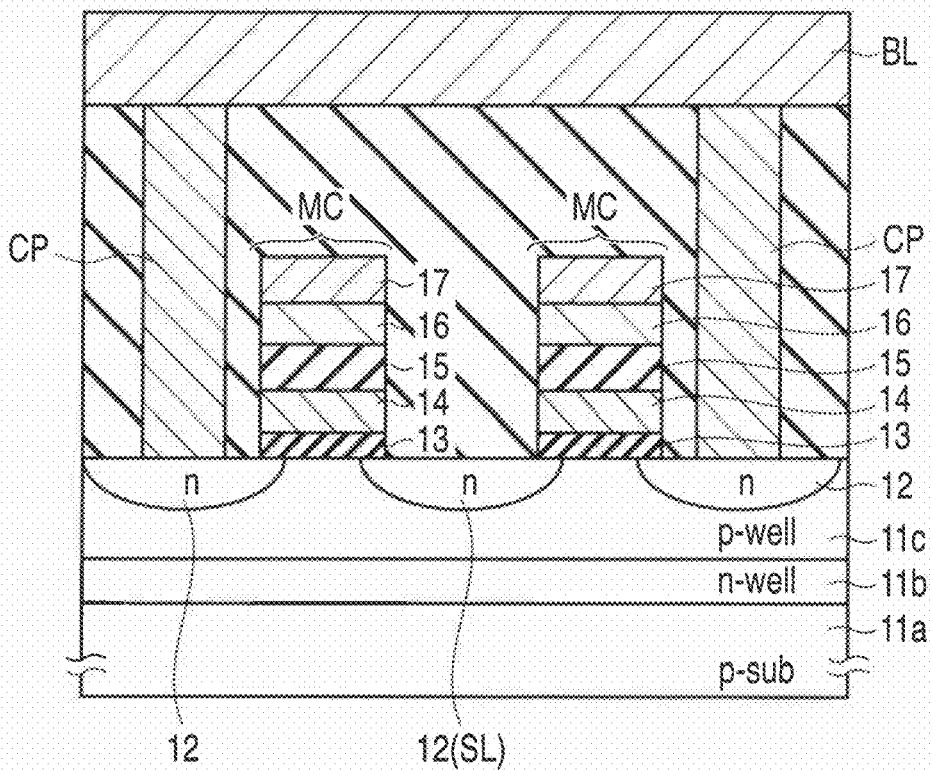
FIG. 12 is a cross-sectional view showing a device structure of the NOR cell unit.

FIG. 11 shows a circuit diagram of a NOR cell unit. FIG. 12 shows a device structure of the NOR cell unit.

The n-type well region 11b and the p-type well region 11c are formed in the p-type semiconductor substrate 11a. A NOR cell including the memory cell of the invention is formed in the p-type well region 11c.

The NOR cell is formed by one memory cell (MIS transistor) MC connected between the bit line BL and the source line SL.

The memory cell MC is formed by the gate insulating film 13 on a channel region between the both n-type diffusion areas 12, the floating gate electrode 14 on the gate insulating film 13, the inter-electrode insulating film 15 on the floating gate electrode 14, and the control gate electrodes 16 and 17 on the inter-electrode insulating film 15.

(3) 2-Tr Cell Flash Memory

Figure 13:
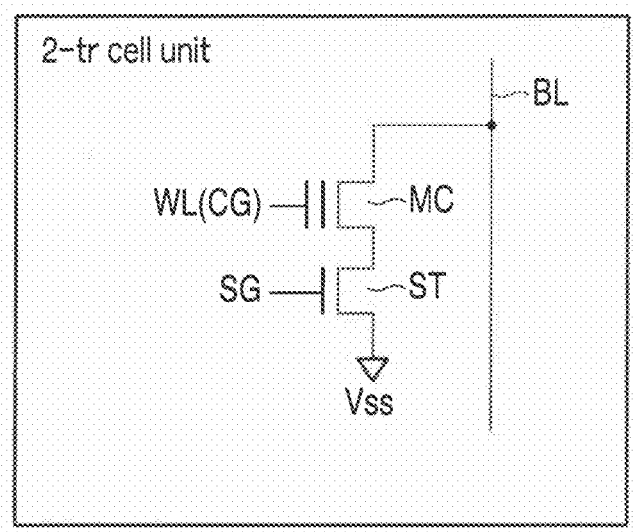
FIG. 13 is a circuit diagram showing a 2-Tr cell unit.
Figure 14:
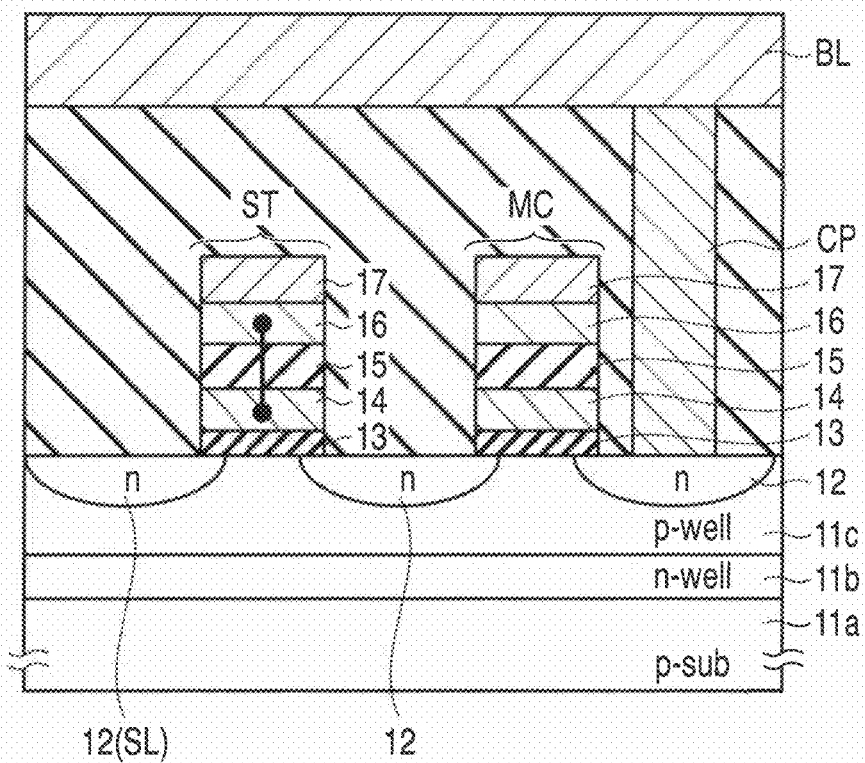
FIG. 14 is a cross-sectional view showing a device structure of the 2-Tr cell unit.

FIG. 13 shows a circuit diagram of 2-Tr cell unit. FIG. 14 shows a device structure of the 2-Tr cell unit.

The 2-Tr cell is recently developed as a new cell structure with the characteristics of the NAND cell and the NOR cell combined together.

The n-type well region 11b and the p-type well region 11c are formed in the p-type semiconductor substrate 11a. The 2-Tr cell unit including a memory cell of the invention is formed in the p-type well region 11c.

The 2-Tr cell unit is formed by one memory cell MC and one select gate transistor ST connected in series.

Each of the memory cell MC and the select gate transistor ST is formed by the gate insulating film 13 on a channel region between the both n-type diffusion layers 12, the floating gate electrode 14 on the gate insulating film 13, the inter-electrode insulating film 15 on the floating gate electrode 14, and the control gate electrodes 16 and 17 on the inter-electrode insulating film 15.

The select gate transistor ST has the same structure as that of the memory cell MC except that the floating gate electrode 14 is electrically connected to the control gate electrodes 16 and 17 through hole provided in the inter-electrode insulating film 15.

The select gate transistor ST is connected to the source line SL and the memory cell MC is connected to the bit line BL.

(4) Others

The invention can be applied to the AND-type, DINOR-type, and ORNAND-type nonvolatile semiconductor memories.

6. Fabrication Method

A manufacturing method when the nonvolatile semiconductor memory according to the invention is applied to the NAND-type flash memory will be described.

Figure 15:
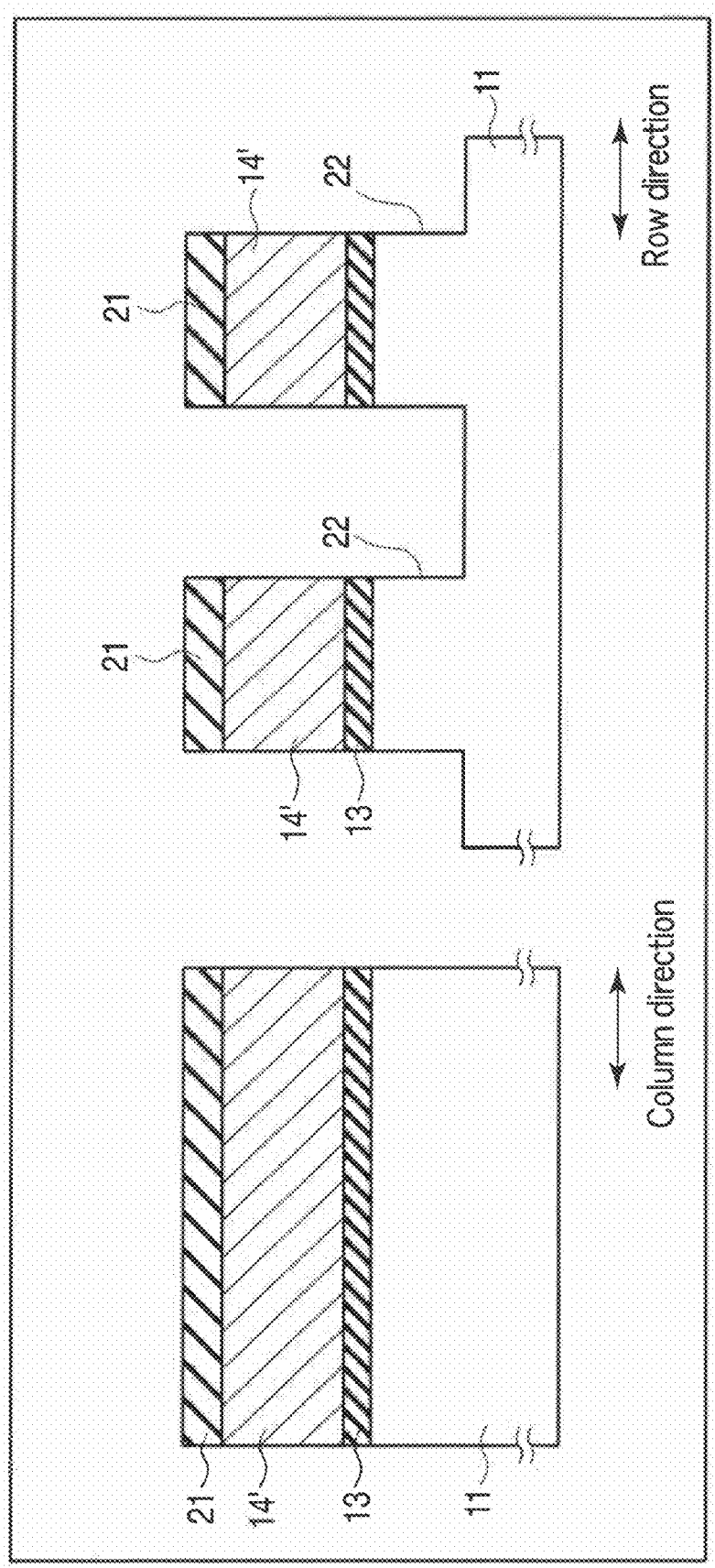
FIG. 15 is a cross-sectional view showing one process of a manufacturing method.

At first, as illustrated in FIG. 15, a tunnel oxide film 13 with thickness of about 4-8 nm is formed on the surface of the silicon substrate 11 with impurities doped through thermal oxidation. Further, a phosphorous doped polysilicon layer 14' with thickness of about 60 nm is formed on the tunnel oxide film 13 according to the CVD (chemical vapor deposition) method.

Continuously, a mask member (etching stopper) 21 is formed on the phosphorous doped polysilicon layer 14' according to the CVD method. Resist pattern is formed on the mask member 21.

By using this resist pattern as a mask, the mask member 21, the polysilicon layer 14', the tunnel oxide film 13, and the silicon substrate 11 are sequentially etched according to the RIE (reactive ion etching) method. As the result, an isolation groove 22 about 100 nm deep from the top surface of the mask member 21 is formed.

Figure 16:
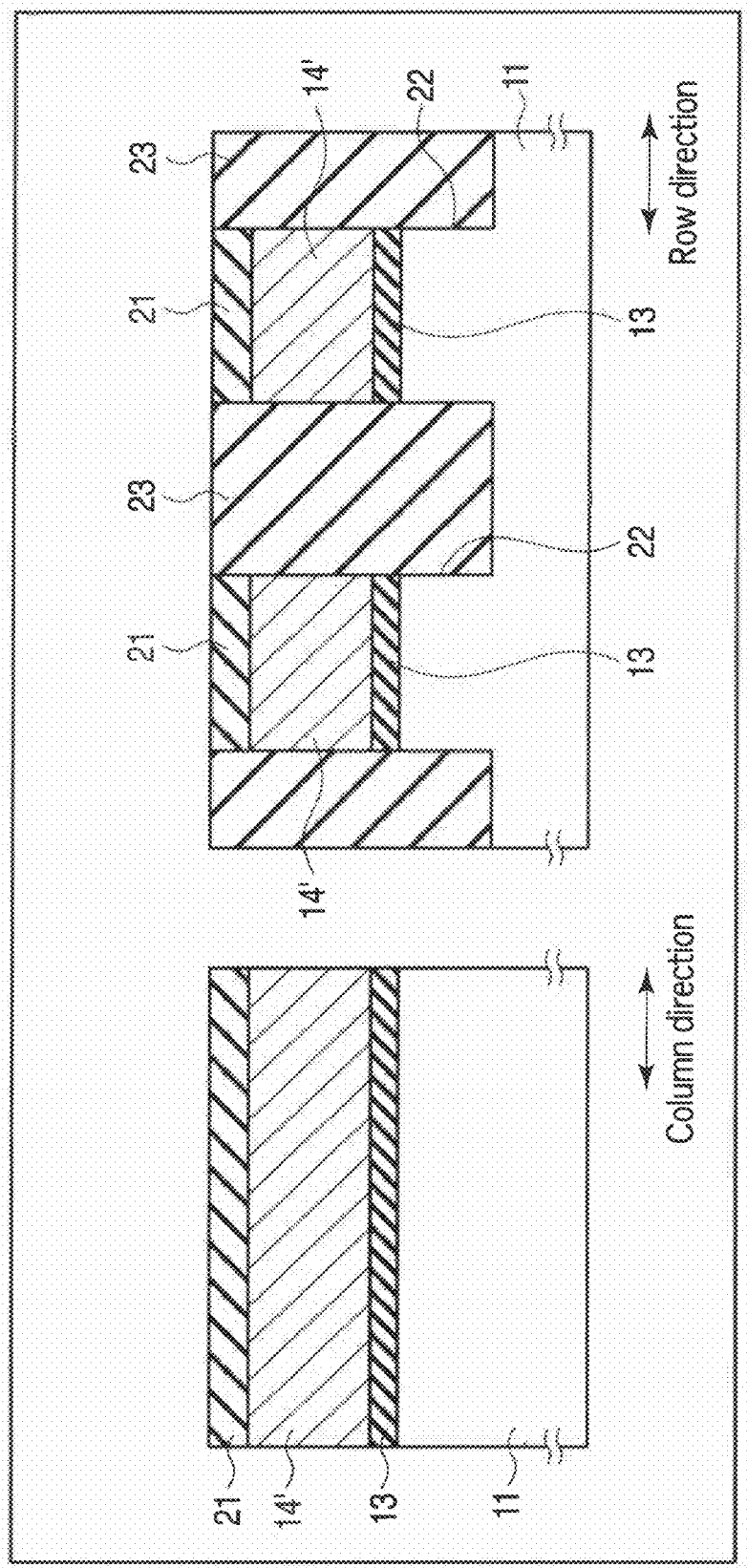
FIG. 16 is a cross-sectional view showing one process of the manufacturing method.

As illustrated in FIG. 16, a silicon oxide film 23 completely filling the isolation groove 22 is formed on the mask member 21 according to the CVD method.

The silicon oxide film 23 is polished according to the CMP (chemical mechanical polishing) in order to leave the silicon oxide film 23 only inside the isolation groove 22. According to this, an element isolation region of the STI (shallow trench isolation) structure formed by the silicon oxide film 23 is formed.

Here, the mask member 21 works to prevent the polysilicon layer 14' from being polished in the CMP and at the same time to control the polishing amount of the silicon oxide film 23. Namely, the top surface of the silicon oxide film 23 inside the isolation groove 22 makes a flat surface together with the top surface of the mask member 21.

Then, the mask member 21 is removed away.

Figure 17:
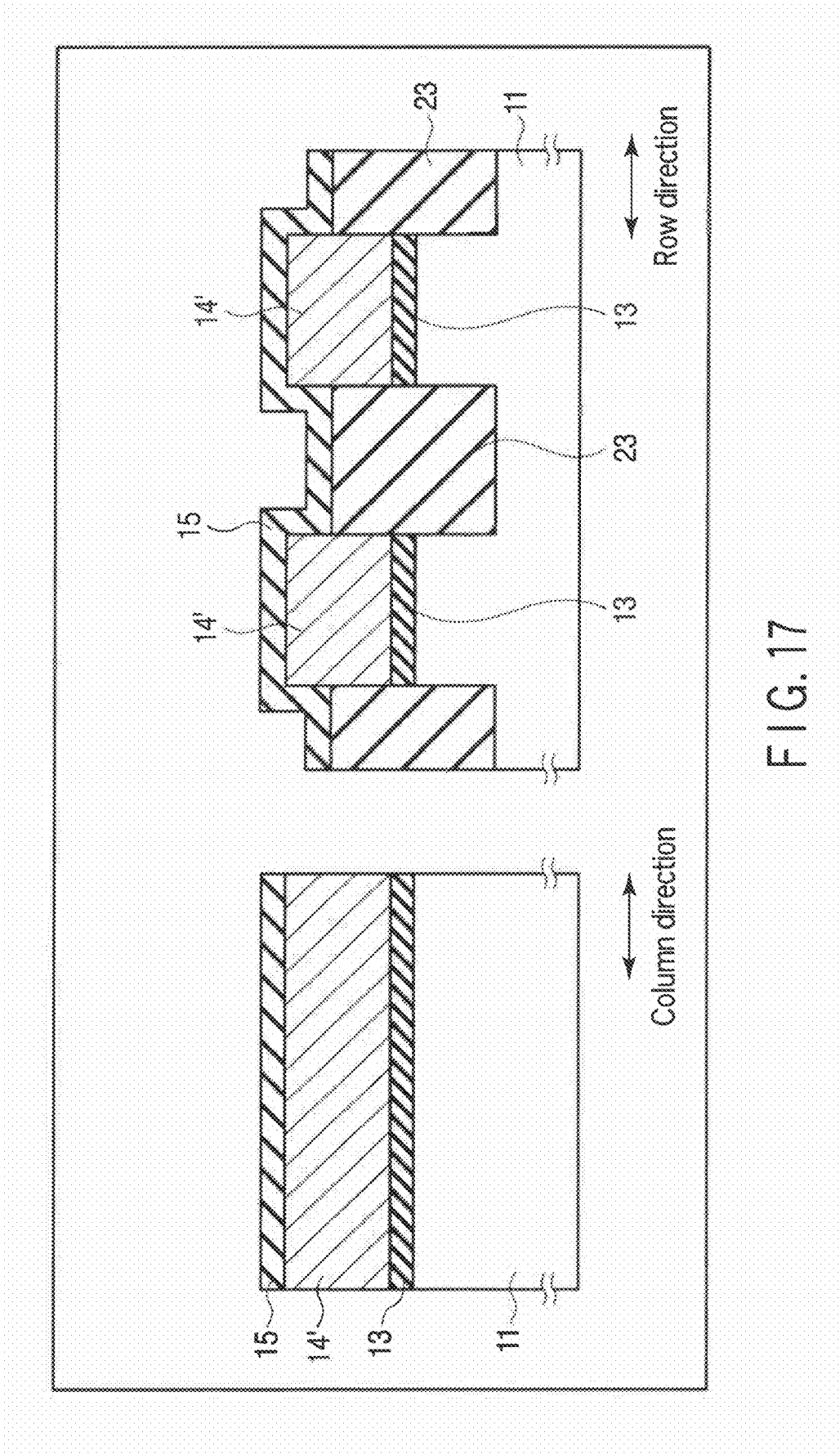
FIG. 17 is a cross-sectional view showing one process of the manufacturing method.

As illustrated in FIG. 17, a solution of diluted hydrofluoric acid is used to etch (planarize by etching) the silicon oxide film 23 so as to expose the lateral surface of the polysilicon layer 14' to some degree along the column direction.

The inter-electrode insulating film 15 is formed on the polysilicon layer 14' and the silicon oxide film 23 in order to cover the top surface and the lateral surface of the polysilicon layer 14'.

A conductive material is formed on the inter-electrode insulating film 15 and the RIE is used to etch the conductive material, the inter-electrode insulating film 15, the polysilicon layer 14', and the tunnel oxide film 13 with the resist pattern used as a mask.

Figure 18:
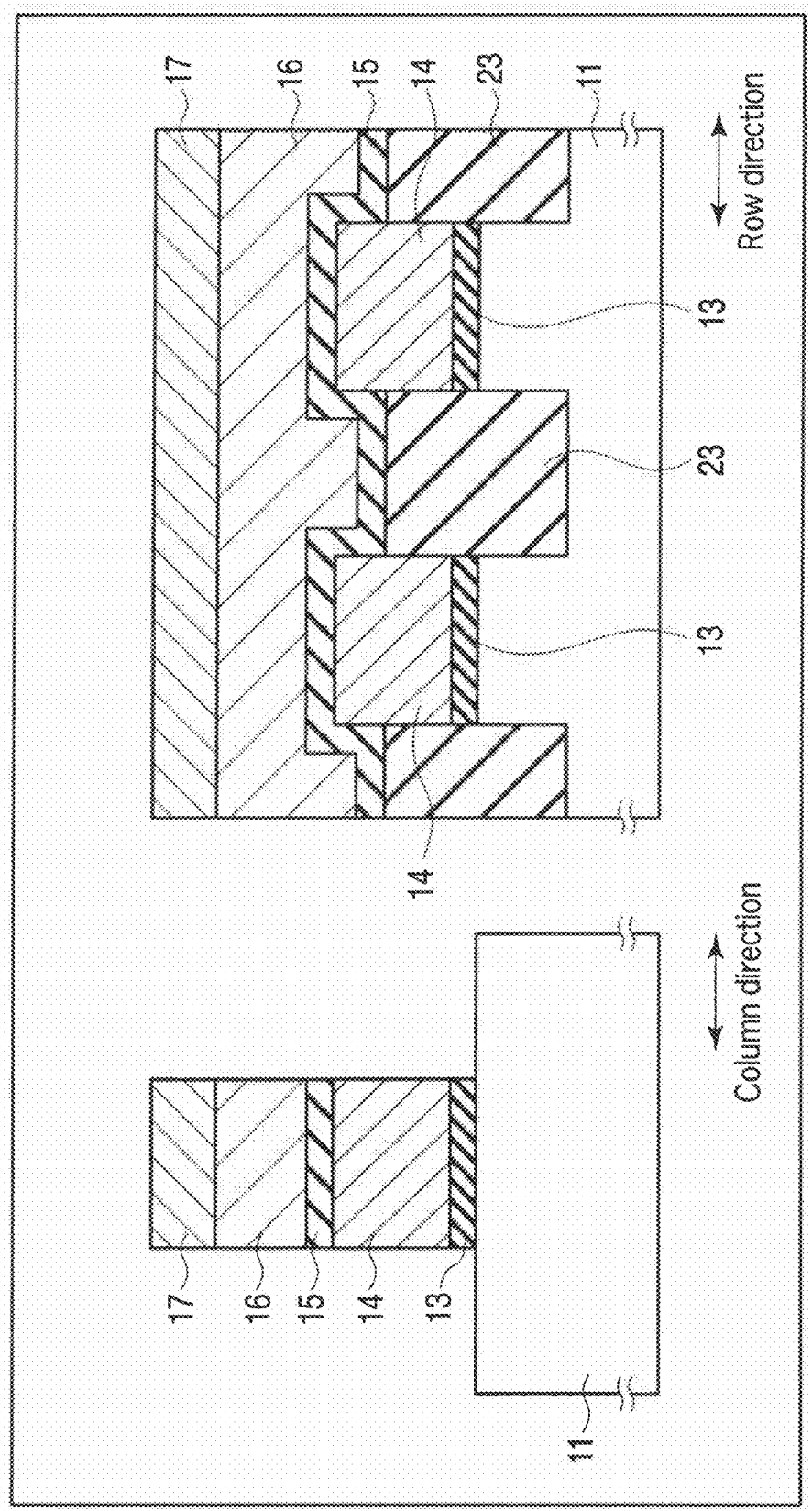
FIG. 18 is a cross-sectional view showing one process of the manufacturing method.

As the result, as illustrated in FIG. 18, a stack gate structure of the floating gate electrode 14 and the control gate electrodes 16 and 17 is completed.

Figure 19:
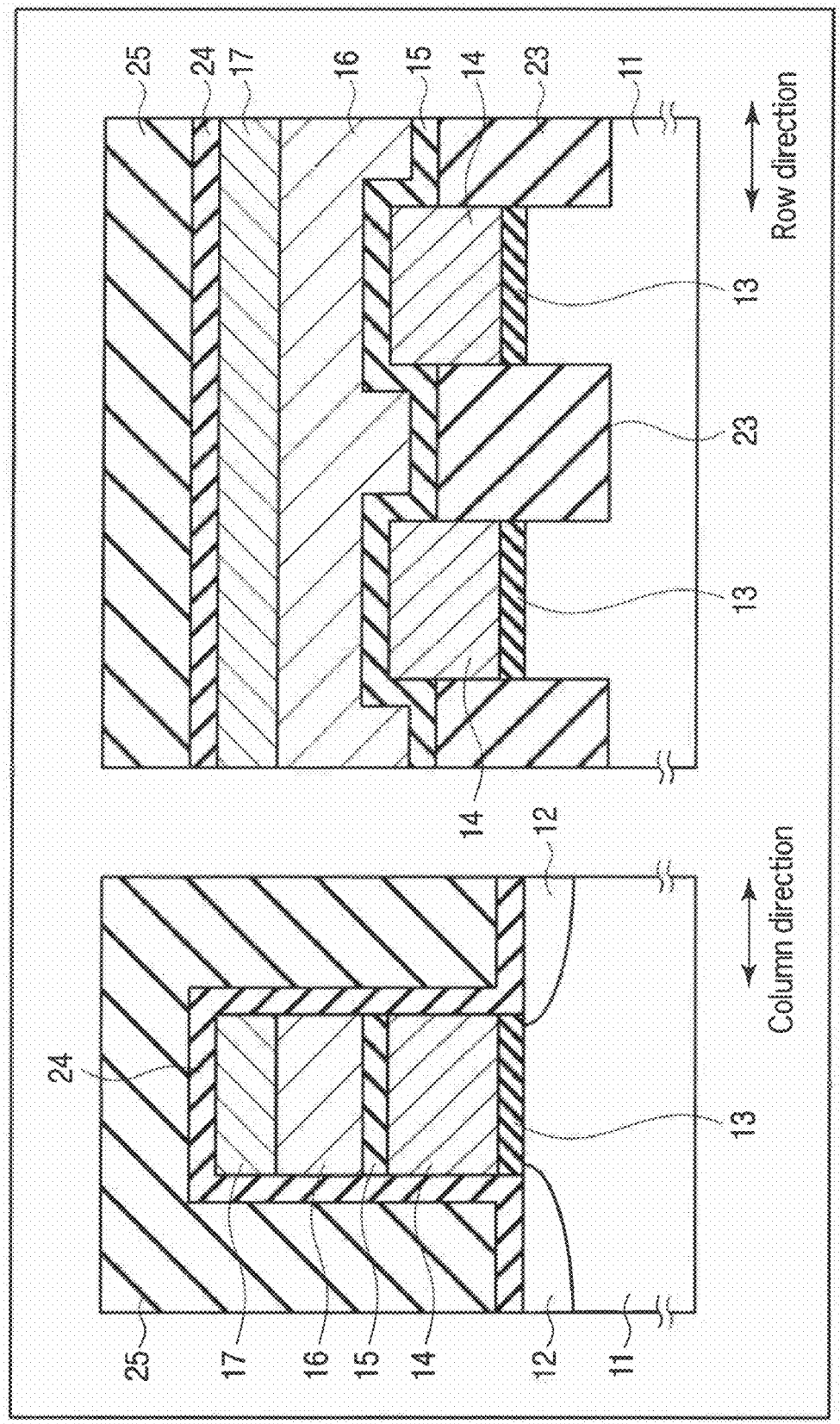
FIG. 19 is a cross-sectional view showing one process of the manufacturing method.

Next, as illustrated in FIG. 19, a silicon oxide film 24 covering the floating gate electrode 14 and the control gate electrodes 16 and 17 is formed through thermal oxidation.

Ions are implanted in the semiconductor substrate 11 through self-alignment according to the ion implantation method with the floating gate electrode 14 and the control gate electrodes 16 and 17 used as a mask, to form the source/drain diffusion areas 12, thereby obtaining a memory cell of the invention.

Then, according to the CVD method, an inter-layer insulating film 25 covering the memory cell of the invention is formed and a wiring layer is formed according to the well known method, thereby completing a nonvolatile semiconductor memory.

Here, the inter-electrode insulating film 15 and the control gate electrodes 16 and 17 are formed, for example, in the following methods corresponding to each of the above embodiments.

For the first and second embodiments (FIG. 2 and FIG. 3)

The LaAlSiO as the inter-electrode insulating film is formed by supplying La, Al, and Si simultaneously by using the molecular beam epitaxy (MBE) method.

Alternatively, lanthanum aluminate (LaAlO) and a material including Si (for example, Si, $SiO_2$, and the like) may be stacked together and the both materials may be mixed through thermal treatment at high temperature, thereby forming the lanthanum aluminate with Si added.

When forming the barrier layers ($Al_2O_3$) on and under the inter-electrode insulating film 15, the barrier layers are formed according to the ALD (atomic layer deposition) method.

The Si/WSi as the control gate electrode is made by forming tungsten (W) on the polysilicon (Si) according to the CVD method with $W(CO)_6$ used as material gas and then by reacting one of the polysilicon with tungsten to convert it into WSi in the heating process.

The LaAlSiO may be formed according to the CVD, the ALD, the sputtering, the vapor deposition, or the laser ablation method. The W may be formed according to the MBE, the ALD, the sputtering, the vapor deposition, or the laser ablation method.

For the Third Embodiment (FIG. 4)

The LaAlSiO as the inter-electrode insulating film is formed by supplying La, Al, and Si simultaneously according to the molecular beam epitaxy (MBE).

Alternatively, lanthanum aluminate (LaAlO) and a material including Si (for example, Si, SiO$_2$, and the like) may be stacked together and the both materials may be mixed through thermal treatment at high temperature, thereby forming the lanthanum aluminate with Si added.

When forming a barrier layer (Al$_2$O$_3$) just under the inter-electrode insulating film 15, the barrier layer is formed according to the ALD method.

The TaC as the control gate electrode is formed according to the sputtering method.

The WSi as the control gate electrode is made by forming tungsten (W) on the polysilicon (Si) according to the CVD method with W(CO)$_6$ used as material gas and then by reacting the whole polysilicon with tungsten to convert it into WSi in the heating process.

The LaAlSiO may be formed according to the CVD, the ALD, the sputtering, the vapor deposition, or the laser ablation method. The W may be formed according to the MBE, the ALD, the sputtering, the vapor deposition, or the laser ablation method.

For the Fourth and fifth Embodiments (FIGS. 5 and 6)

Since the fourth and fifth embodiments are the MONOS type, it is necessary to replace the floating gate electrode 14 with a charge storage layer and the inter-electrode insulating film 15 with a block insulating film.

The LaAlSiO as the block insulating film is formed by supplying La, Al, and Si simultaneously according to the molecular beam epitaxy (MBE) method.

Alternatively, lanthanum aluminate (LaAlO) and a material including Si (for example, Si, SiO$_2$, and the like) may be stacked together and the both materials may be mixed through thermal treatment at high temperature, thereby forming the lanthanum aluminate with Si added.

When forming barrier layers (Al$_2$O$_3$) on and under the block insulating film, the barrier layers are formed according to the ALD method.

The SiN as the charge storage layer is formed according to the LPCVD method with DCS (dichlorosilane) and NH$_3$ as raw materials. The SiN may be formed by nitriding the polysilicon with NH$_3$ nitride or radical nitride or according to the ALD method with DCS and NH$_3$ as raw materials.

The Si/WSi as the control gate electrode is formed by forming tungsten (W) on the polysilicon (Si) according to the CVD method with W(CO)$_6$ used as material gas and then by reacting one of the polysilicon with tungsten, to convert it into WSi in the heating process.

The LaAlSiO may be formed according to the CVD, the ALD, the sputtering, the vapor deposition, or the laser ablation method. The W may be formed according to the MBE, the ALD, the sputtering, the vapor deposition, or the laser ablation method.

For the Sixth Embodiment (FIG. 7)

Since the sixth embodiment is also the MONOS type, it is necessary to replace the floating gate electrode 14 with a charge storage layer and the inter-electrode insulating film 15 with a block insulating film.

The LaAlSiO as the block insulating film is formed by supplying La, Al, and Si simultaneously according to the molecular beam epitaxy (MBE) method.

Alternatively, lanthanum aluminate (LaAlO) and a material including Si (for example, Si, SiO$_2$, and the like) may be stacked together and the both materials may be mixed through thermal treatment at high temperature, thereby forming the lanthanum aluminate with Si added.

When forming a barrier layer (Al$_2$O$_3$) just on the block insulating film, the barrier layer is formed according to the ALD method.

The AlOx as the charge storage layer is formed according to the ALD method.

The Si/WSi as the control gate electrode is made by forming tungsten (W) on the polysilicon (Si) according to the CVD method with W(CO)$_6$ used as material gas and then by reacting one of the polysilicon with tungsten to convert it into WSi in the heating process.

The LaAlSiO may be formed according to the CVD, the ALD, the sputtering, the vapor deposition, or the laser ablation method. The W may be formed according to the MBE, the ALD, the sputtering, the vapor deposition, or the laser ablation method.

For the Seventh Embodiment (FIG. 8)

Since the seventh embodiment is also the MONOS type, it is necessary to replace the floating gate electrode 14 with a charge storage layer and the inter-electrode insulating film 15 with a block insulating film.

The LaAlSiO as the block insulating film is formed by supplying La, Al, and Si simultaneously according to the molecular beam epitaxy (MBE) method.

Alternatively, lanthanum aluminate (LaAlO) and a material including Si (for example, Si, SiO$_2$, and the like) may be stacked together and the both materials may be mixed through thermal treatment at high temperature, thereby forming the lanthanum aluminate with Si added.

The AlOx as the charge storage layer is formed according to the ALD method.

The TaC as the control gate electrode is formed according to the sputtering method.

The WSi as the control gate electrode is made by forming tungsten (W) on the polysilicon (Si) according to the CVD method with W(CO)$_6$ used as material gas and then by reacting the whole polysilicon with tungsten, to convert it into WSi in the heating process.

The LaAlSiO may be formed according to the CVD, the ALD, the sputtering, the vapor deposition, or the laser ablation method. The W may be formed according to the MBE, the ALD, the sputtering, the vapor deposition, or the laser ablation method.

7. CONCLUSION

By forming the inter-electrode insulating film of the floating gate memory cell and the block insulating film of the MONOS type memory cell in a single layer or a stack layer of insulator including La, Al, and Si, the invention can keep the above films amorphous even after the heating process at a high temperature, thereby restraining the degradation of electrical characteristic caused by the crystallization of film.

Accordingly, it can improve the coupling ratio by increasing the high dielectric constant in the inter-electrode insulating film or the block insulating film and at the same time it can lower the leak current characteristic in the inter-electrode insulating film or the block insulating film, while keeping the stability against heat.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    a semiconductor region;
    source/drain areas arranged separately in the semiconductor region;
    a tunnel insulating film arranged on a channel region between the source/drain areas;
    a floating gate electrode arranged on the tunnel insulating film;
    an inter-electrode insulating film including La, Al and Si, which is arranged on the floating gate electrode; and
    a control gate electrode arranged on the inter-electrode insulating film,
    wherein composition ratio of the inter-electrode insulating film is within a range of $0.06<Si/(La+Al)<0.60$.

2. The memory device according to claim 1, wherein the inter-electrode insulating film has a single layer structure or a stack layer structure of insulators.

3. The memory device according to claim 1, wherein the inter-electrode insulating film is amorphous.

4. The memory device according to claim 1, further comprising a barrier layer of Al oxide between the inter-electrode insulating film and the floating gate electrode with Si.

5. The memory device according to claim 1, further comprising a barrier layer of Al oxide between the inter-electrode insulating film and the control gate electrode with Si.

6. The memory device according to claim 1, wherein the control gate electrode includes Ta.

7. The memory device according to claim 1, wherein the tunnel insulating film includes Si.

8. The memory device according to claim 1, wherein conductivity type of the semiconductor region is the same as that of the source/drain regions.

9. The memory device according to claim 1, wherein conductivity type of the semiconductor region is different from that of the source/drain regions.

10. A nonvolatile semiconductor memory device comprising:
    a semiconductor region;
    source/drain areas arranged separately in the semiconductor region;
    a tunnel insulating film arranged on a channel region between the source/drain areas;
    a charge storage layer arranged on the tunnel insulating film;
    a block insulating film including La, Al and Si, which is arranged on the charge storage layer; and
    a control gate electrode arranged on the block insulating film,
    wherein composition ratio of the block insulating film is within a range of $0.06<Si/(La+Al)<0.60$.

11. The memory device according to claim 10, wherein the block insulating film has a single layer structure or a stack layer structure of insulators.

12. The memory device according to claim 10, wherein the block insulating film is amorphous.

13. The memory device according to claim 10, further comprising a barrier layer of Al oxide between the block insulating film and the charge storage layer with Si.

14. The memory device according to claim 10, further comprising a barrier layer of Al oxide between the block insulating film and the control gate electrode with Si.

15. The memory device according to claim 10, wherein the control gate electrode includes Ta.

16. The memory device according to claim 10, wherein the charge storage layer includes at least one of Al and Hf 17. The memory device according to claim 10, wherein conductivity type of the semiconductor region is the same as that of the source/drain regions.

18. The memory device according to claim 10, wherein conductivity type of the semiconductor region is different from that of the source/drain regions.

* * * * *